(12) United States Patent
Chou et al.

(10) Patent No.: US 6,573,741 B2
(45) Date of Patent: Jun. 3, 2003

(54) APPARATUS FOR MEASURING TEMPERATURE PARAMETERS OF AN ISFET USING HYDROGENATED AMORPHOUS AS A SENSING FILM

(76) Inventors: Jung Chuan Chou, 123, Sec. 3, University Rd. Touliu, Yunlin Hsien (TW); Yii Fang Wang, 3, Lane 111, Chung-Hua Rd., Lin 22, Ta-Tung Li, Changhua (TW)

( * ) Notice: Subject to any disclaimer, the term of this patent is extended or adjusted under 35 U.S.C. 154(b) by 0 days.

(21) Appl. No.: 10/131,777

(22) Filed: Apr. 23, 2002

(65) Prior Publication Data

US 2002/0158645 A1 Oct. 31, 2002

Related U.S. Application Data

(62) Division of application No. 09/768,518, filed on Jan. 24, 2001.

(30) Foreign Application Priority Data

Jul. 20, 2000 (TW) ........................................ 89114504 A

(51) Int. Cl.[7] ........................ G01R 31/02; G01R 31/26; H01L 21/66
(52) U.S. Cl. ........................ 324/760; 324/750; 438/14

(58) Field of Search ..................... 205/789; 324/750, 324/760, 71.1; 257/253, 57, 414; 438/14, 151, 158

(56) References Cited

U.S. PATENT DOCUMENTS

| 4,660,063 A | 4/1987 | Anthony |
| 4,691,167 A | 9/1987 | Vlekkert et al. |
| 4,735,702 A | 4/1988 | Reinhoudt et al. |
| 4,812,220 A | 3/1989 | Iida et al. |
| 5,035,791 A | 7/1991 | Battilotti et al. |
| 5,061,976 A | 10/1991 | Shimomura et al. |
| 5,130,265 A | 7/1992 | Battilotti et al. |
| 5,309,085 A | 5/1994 | Sohn |
| 5,319,266 A | 6/1994 | Chu et al. |
| 5,511,428 A | 4/1996 | Goldberg et al. |
| 5,777,372 A * | 7/1998 | Kobashi ................ 257/414 |
| 5,911,873 A | 6/1999 | McCarron et al. |

* cited by examiner

Primary Examiner—Kamand Cuneo
Assistant Examiner—Paresh Patel

(57) ABSTRACT

An apparatus for measuring the temperature parameters of an ISFET that uses hydrogenated amorphous silicon as a sensing film, which uses the measurements of the temperature parameters and the source/drain current and gate voltage in an unknown solution to sense the ion concentration and the pH value of the unknown solution.

7 Claims, 4 Drawing Sheets

6,573,741 B2

APPARATUS FOR MEASURING TEMPERATURE PARAMETERS OF AN ISFET USING HYDROGENATED AMORPHOUS AS A SENSING FILM

CROSS REFERENCE TO RELATED APPLICATION

This application is a divisional application of U.S. patent application Ser. No. 09/768,518, now allowed, filed Jan. 24, 2001, which is hereby incorporated by reference in its entirety.

BACKGROUND OF THE INVENTION

1. Field of the Invention

The invention relates to a method and an apparatus of measuring the temperature parameters of an ISFET, and more particularly, to a method and an apparatus of measuring the temperature parameters of an ISFET that uses hydrogenated amorphous silicon as a sensing film.

2. Description of the Prior Art

Ion sensitive field effect transistor (ISFET) is constructed by substituting a sensing film for the metal gate on the gate oxide of a traditional MOSFET. When the ISFET is dipped into a solution, the interfacial potential between the sensing film and the solution will influence the semiconductor surface since only an extremely thin dielectric (that is, the gate oxide) separates the sensing film and the semiconductor surface. This influences the charge density in the inverse layer of the semiconductor surface, and thereby modulates the channel current passing through the ISFET. Therefore, by utilizing this characteristic, the pH value or other ion concentration in the solution can be deduced from the measurement of source/drain current and the gate voltage of the ISFET. Furthermore, the potential difference on the interface between the sensing film and the solution is in relation to the ion activity in the solution. The hydrogen ion activity in the solution can be measured by using different channel currents caused by different interfacial potential differences in varied solutions with different hydrogen ion activity.

The patents, which are related to the formation of the ISFET or the measurement of the ISFET, are listed hereinafter.

(1) U.S. Pat. No. 5,319,266 discloses a method of using $Ta_2O_5$ as the sensing film in the pH-ISFET. A radio frequency sputtering method is employed to sputter a $Ta_2O_5$ film of a thickness 400–500A on a gate dielectric layer made of silicon nitride/silicon oxide. Then, an annealing process is performed in oxygen for one hour at a temperature controlled between 375° C. and 400° C. Compared with the traditional pH-ISFET, this prevention has better sensitivity and reliability.

(2) U.S. Pat. No. 5,130,265 discloses a method of fabricating the ISFET with multiple functions. The method comprises using siloxanic prepolymer as the sensitive film, mixing the solution, photochemistry treatment and heat treatment.

(3) U.S. Pat. No. 5,035,791 discloses a method that uses an organic film such as polysiloxanic to form the sensing film in the ISFET and related processes of the device.

(4) U.S. Pat. No. 5,061,976 discloses a method that covers a carbon thin film on the gate oxide of the ISFET and then covers a 2,6 xylenol electrolytic polymerization film on thereof. The ISFET has the ability to sense hydrogen ions and the advantages of small drift time, high reliability and insensitive to light. When other thin films are covered on the ISFET, other kinds of ions can be sensed.

(5) U.S. Pat. No. 4,812,220 discloses a method of precisely measuring glutamate concentration by diminished enzyme sensor, wherein a method of fixing enzyme on the substrate and a converter that transforms the variations of matter amount into electric signals.

(6) U.S. Pat. No. 5,511,428 discloses an ISFET with a back contact structure that is applied to micro sensors such as a pressure sensor, a shearing stress sensor, and a temperature sensor or micro regulators.

(7) U.S. Pat. No. 4,691,167 discloses a method of measuring ion activity in the solution by combining the ISFET, the reference electrode, the temperature sensor, amplified circuits, calculation and memory circuits. Since the sensitivity is a function of temperature and drain current and is decided by a variable of gate voltage, the sensitivity can be obtained by calculating formulas stored in the memory.

(8) U.S. Pat. No. 4,660,063 discloses a method of performing both laser drilling and solid diffusion to form a three-D diode array on the semiconductor wafer. The laser is first employed to drill the wafer, and then the impurities are diffused from the hole to form a cylindrical PN junction and complete a non-plane ISFET structure.

(9) U.S. Pat. No. 5,911,873 provides a device that comprises ISFET, reference electrode device, ISFET control circuits, memory, measuring circuits and diagnosis circuits to measure ion concentration in the solution. The ISFET control circuits operate the equipment at a certainly drain/source voltage and a gate/source voltage that is relative to n continuous drain currents. The memory stores the repetitions of the ISFET characteristics, continuous drain current, and gate/source voltage. The measuring circuits measure ion concentration by using a group of n continuous drain currents and gate/source voltage and the repetition of the ISFET characteristics. The diagnosis circuits measure the ISFET characteristics by using n continuous drain currents and gate/source voltage.

(10) U.S. Pat. No. 5,309,085 integrates the measuring circuit of a creature sensor having ISFET on a wafer. The measuring circuit has two ISFET devices that are an enzyme ISFET and a reference electrode FET and whose output signals can be amplified by using a differential amplifier.

(11) U.S. Pat. No. 4,735,702 provides a polymer covered on the oxide layer of the ISFET, wherein a chemical bonding will be formed on the interface between the polymer and oxide layer so as to form the sensitive film.

However, since the ISFET is a semiconductor device, the change of temperature affects all data obtained by measuring the ISFET for a long time, and thus causes a measuring error. In order to prevent the measuring error, the ISFET must be operated under a specific temperature to ensure the accuracy of the measuring result. In view of the experimental conditions and facilities at the present day, controlling the measuring temperature to keep the ISFET in a constant temperature state is not a perfect method.

SUMMARY OF THE INVENTION

It is therefore a primary objective of the invention to provide a method of measuring the temperature parameters of an ISFET that uses hydrogenated amorphous silicon as a sensing film, which uses the measurements of the temperature parameters and the source/drain current and gate voltage in an unknown solution to deduce the ion concentration and the pH value of the unknown solution (such as sensitivity or temperature coefficient).

Another object of the invention is to provide an apparatus for measuring the temperature parameters of an ISFET that uses hydrogenated amorphous silicon as a sensing film, which uses ordinary functions of controlling temperature, measuring temperature and measuring current/voltage to completely measure the temperature parameters (such as sensitivity or temperature coefficient).

In order to achieve one object of the invention, a method of measuring the temperature parameters of an ISFET that uses hydrogenated amorphous silicon as a sensing film is provided. At the step b1, make the sensing film contact a buffer solution. At step b2, change the pH value of the buffer solution at a predetermined temperature and use a current/voltage measuring device to measure and record the source/drain current and the gate voltage of the ISFET so as to obtain a curve. At step b3, select a fixed current from the curve to obtain the temperature parameter at the predetermined temperature. At step b4, change the temperature of the buffer solution to repeat the steps b1 to b3 so as to obtain the temperature parameters at the different temperatures.

In order to achieve another object of the present invention, another method of measuring the temperature parameters of an ISFET that uses hydrogenated amorphous silicon as a sensing film is provided. At step b1, make the sensing film contact a buffer solution. At step b2, change the pH value of the buffer solution and use a current/voltage measuring device to measure and record the source/drain current and the gate voltage of the ISFET for a temperature range so as to obtain a curve. At step b3, use the curve to gain a zero temperature coefficient point and an average current at each pH value. At step b4, operate the ISFET at the average current and use the current/voltage measuring device to measure the gate voltage of the ISFET.

In order to achieve another object of the invention, an apparatus for measuring the temperature parameters of an ISFET that uses hydrogenated amorphous silicon as a sensing film is provided. The apparatus comprises a semiconductor substrate where the ISFET is formed wherein the semiconductor substrate comprises a pair of source and drain separated by each other and the sensing film insulated from the surface of the semiconductor substrate; a buffer solution for contacting the ISFET a light-isolating container for loading the buffer solution and isolating light; a heater for heating the buffer solution; a temperature controller connected with the heater; a test fixture connected with the source and drain of the ISFET; and a current/voltage measuring device connected the test fixture.

It is an advantage of the invention that after measuring the source/drain current and the gate voltage in an unknown solution, the temperature parameters can be utilized to deduce the ion concentration or pH value of the unknown solution with unknown concentration.

This and other objectives of the invention will no doubt become obvious to those of ordinary skill in the art after having read the following detailed description of the preferred embodiment which is illustrated in the various figures and drawings.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE PREFERRED EMBODIMENT

Figure 1:
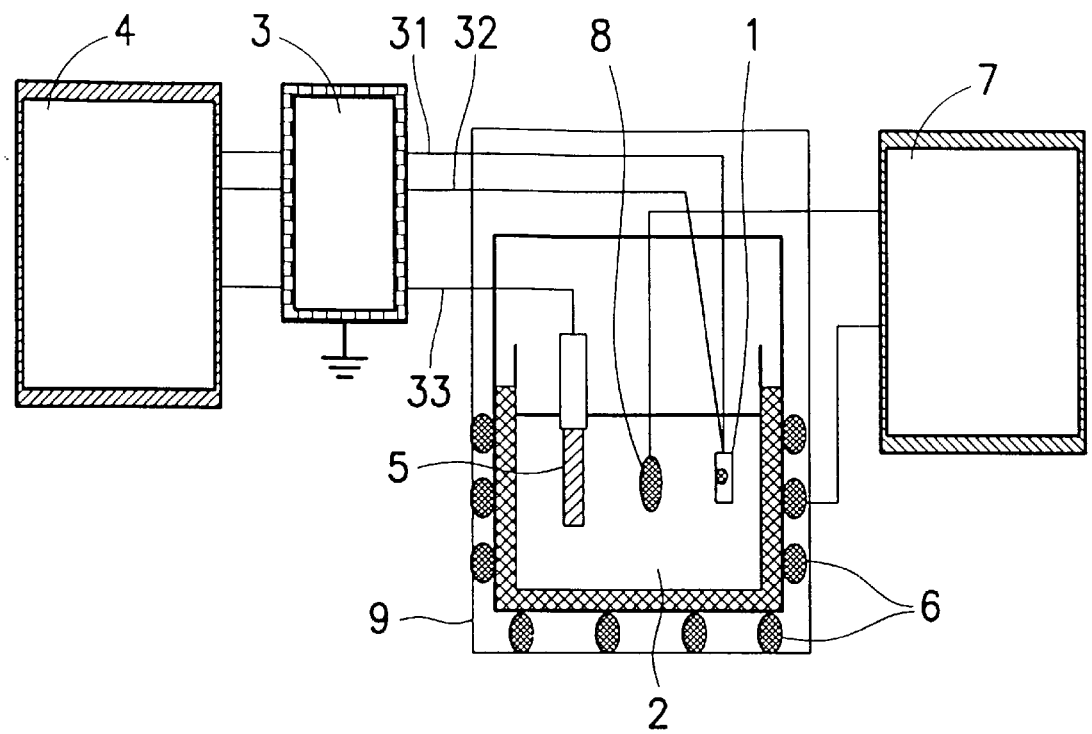
FIG. 1 shows a systematic structure diagram according to the present invention.

Please refer to FIG. 1. FIG. 1 shows a systematic structure diagram according to the invention. An ISFET using hydrogenated Amorphous silicon as a sensing film (called a-Si:H ISFET) 1 is dipped into a buffer solution 2 such as the phosphate buffer solution that is stored in a container not titled). The source/drain (not shown) of the a-Si:H ISFET 1 respectively connects a test fixture 3 through two connecting wires 31 and 32 so as to convey the electrical signals obtained by Measuring the source/drain to a current/voltage measuring device 4. The current/voltage measuring device 4 is the Keithley-236 current/voltage measuring device for data processing.

Also, a reference electrode 5 is dipped into the buffer solution 2, and one end of the reference electrode 5 is connected with the test fixture 3 through the connecting wire 33. A heater 6 is installed outside the container and connected with a PID temperature controller 7. When the temperature of the buffer solution 2 is rising or descending, the PID temperature controller 7 is in charge of controlling the heater 6 to stop heating or start heating. A thermometer 8 that is connected with the PID temperature controller 7 senses the temperature of the buffer solution 2 and contacts thereof. The above-mentioned elements such as the buffer solution 2, the elements contacting the buffer solution 2 and the heater 6 are placed in a light-isolating container (a dark chamber) 9 so as to prevent the measuring data being affected from light. What should be noticed in the preferred embodiment of the invention is that the interfacial potential between the a-Si:H sensing film and the solution and the characteristic difference of charge density in the inversion layer of the semiconductor surface are used to measure needed data (such as the source/drain current or the gate voltage) and thus obtain the temperature parameters of the ISFET.

Figure 2:
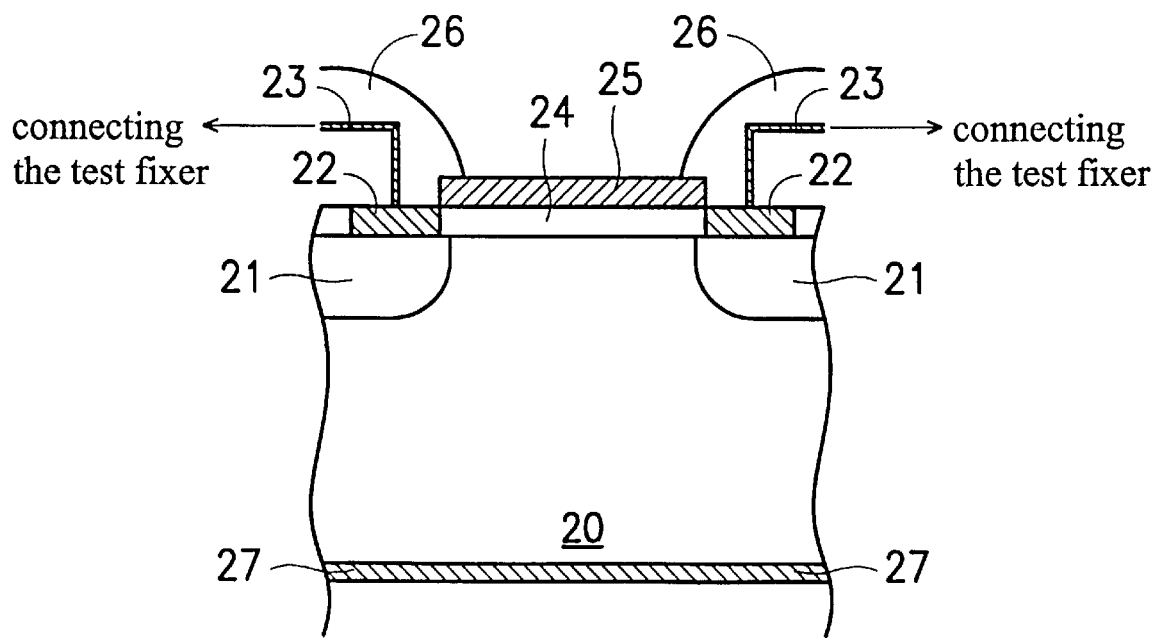
FIG. 2 shows a schematic cross-section diagram of the a Si:H ISFET according to the present invention.

Please refer to FIG. 2. FIG. 2 is a schematic cross-section diagram of the a-Si:H ISFET according to the invention. The a-Si:H ISFET is formed on a semiconductor substrate 20, a p-type silicon substrate. A pair of source/drain regions 21 separated from each other is formed near the top surface of the semiconductor substrate 20 and each region 21 is connected with the test fixture outside through an aluminum contact plug 22 and an aluminum wire 23. A gate oxide 24, like a silicon oxide layer, and an a-Si:H sensing film 25 are sequentially formed on the semiconductor substrate 20.

Then, an epoxy resin 26 is employed to seal the device so that only the surface of the a-Si:H sensing film 25 is exposed. Besides, a metal-aluminum layer 27 is formed at the bottom of the semiconductor substrate 20.

With reference to the apparatus shown in FIG. 1 and the device shown in FIG. 2, the temperature parameters of the a-Si:H ISFET of the invention can be measured according to a method listed below. First, with regard to the measurement of the sensitivity, the sensing film of the a-Si:H ISFET is contacted the buffer solution (step a1). Then, fix the temperature of the buffer solution, such as at 25° C., to change the pH value of the buffer solution at the same time. The Keithley-236 current/voltage measuring device can measure and record a curve related to the source/drain current and the gate voltage of the a-Si:H ISFET (step a2). With reference to the statistical result shown as a curve in FIG. 3, both the source/drain current and the gate voltage of the a-Si:H ISFET rise with increasing pH value.

Figure 3:
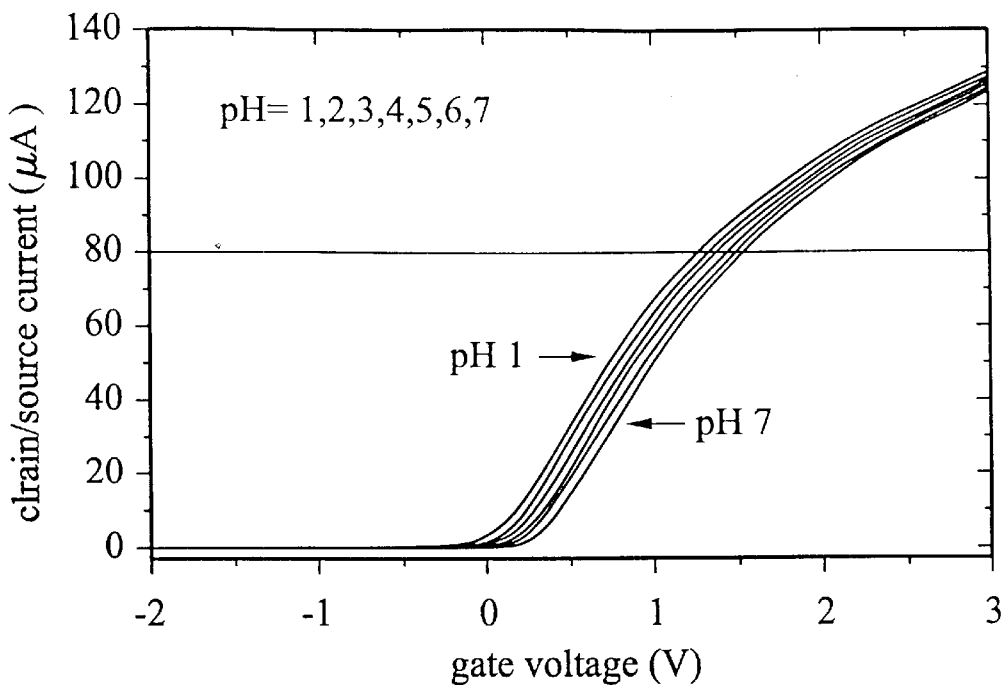
FIG. 3 shows a curve related to the source/drain current and the gate voltage at 25° C. according to the present invention.
Figure 4:
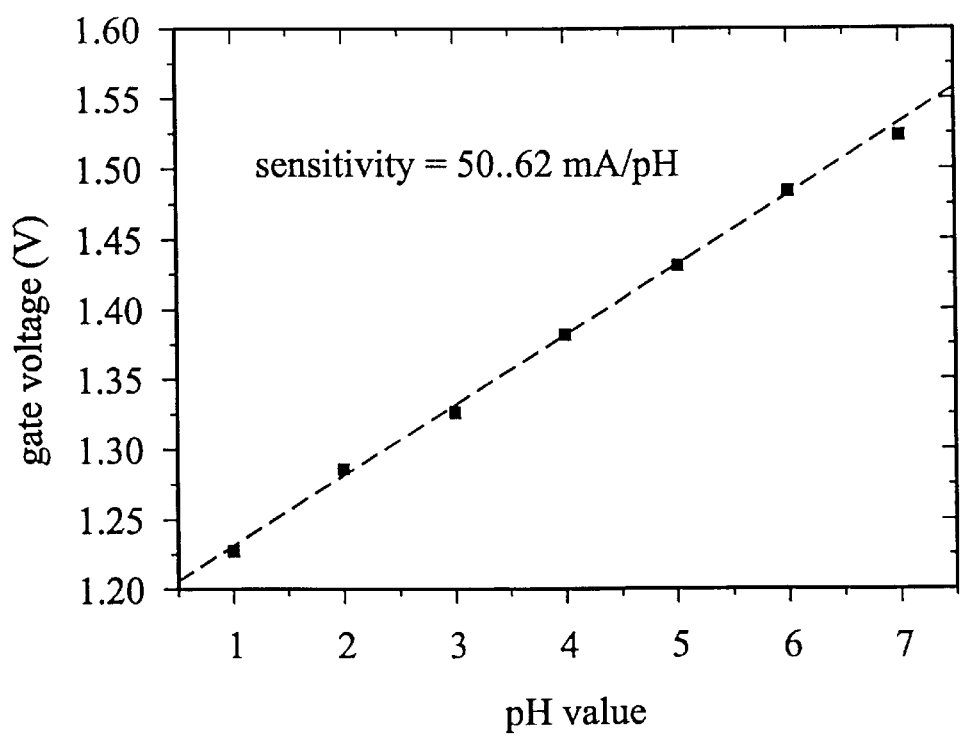
FIG. 4 shows a curve related to the gate voltage and the pH value at 25° C. according to the present invention.

Next, select a fixed current of the curve (for example 80 $\mu$A) in FIG. 3 to obtain a curve related to the gate voltage and the pH value under a specific temperature (for example 25° C.) as shown in FIG. 4 (step a3), wherein the sensitivity of the a-Si:H ISFET at 25° C. is 50.62 mV/pH. It is found that the gate voltage of the a-Si:H ISFET is in direct proportional to the pH value of the buffer solution and the slope of the curve is the sensitivity of the a-Si:HISFET at the specific temperature.

Figure 5:
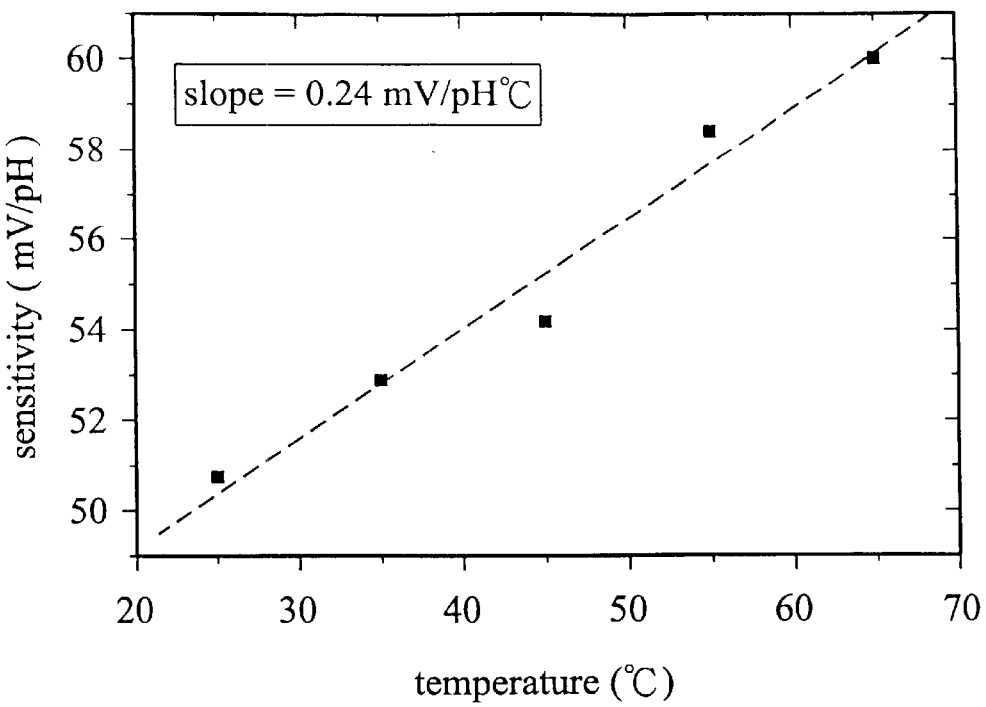
FIG. 5 shows a curve related to sensitivities and temperature according to the present invention.

Moreover, in order to measure the sensitivity of the a-Si:H ISFET at different temperatures, it only needs to change the temperature of the buffer solution, such as between 25° C.–65° C., and repeats the step a1–a3 at each temperature. The obtained sensitivities at different temperatures make a curve shown in FIG. 5 (step a4), wherein the sensitivity is in direct proportional to the rising temperature and the slope of the curve is about 0.24 mV/pH° C.

Figure 6:
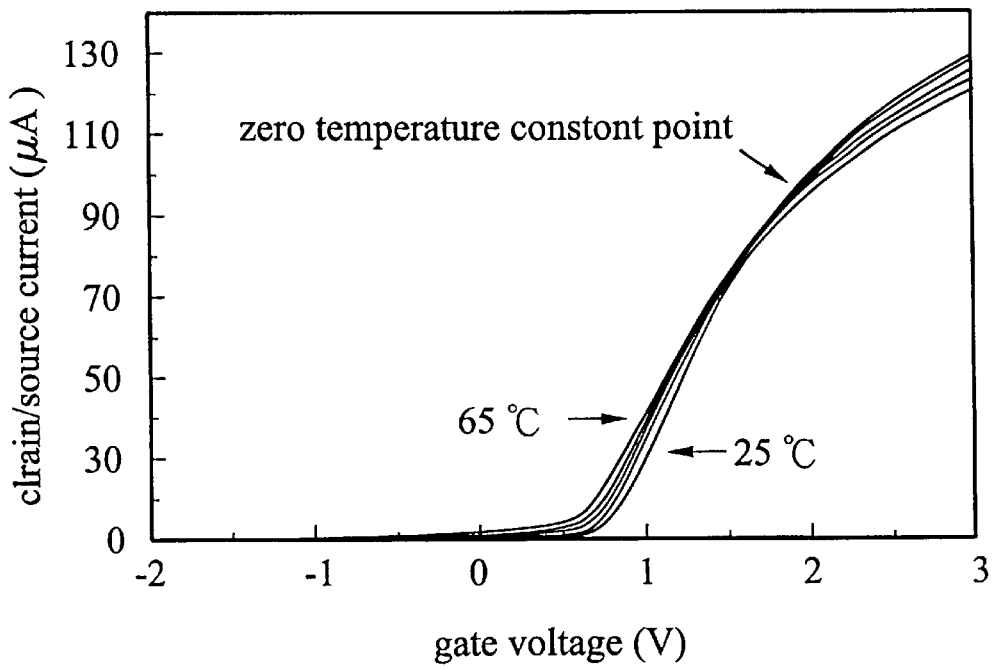
FIG. 6 shows a curve related to the source/drain current and the gate voltage at pH=1 according to the present invention.

Next, the temperature parameters of the invention can be measured by the method listed below. First, make the a-Si:H ISFET contact with the buffer solution (step b1). Then, fix the pH value of the buffer solution at pH=1, and use the Keithley-236 current/voltage measuring device to measure and record the data to form a curve related to the source/drain current and the gate voltage of the a-Si:H ISFET at a specific temperature range (such as 25° C.–65° C.) as shown in FIG. 6(step b2). The first information is that the threshold voltage of the a-Si:H ISFET shifts toward the negative direction in accordance with the increasing temperature. The second information is that the source/drain current and the gate voltage of the a-Si:H ISFET descend with the increasing temperature. The third information is that a zero temperature coefficient point is found where the source/drain current and the gate voltage cannot change when the temperature is changed. The source/drain current corresponding to the point is called zero temperature coefficient point current.

Figure 7:
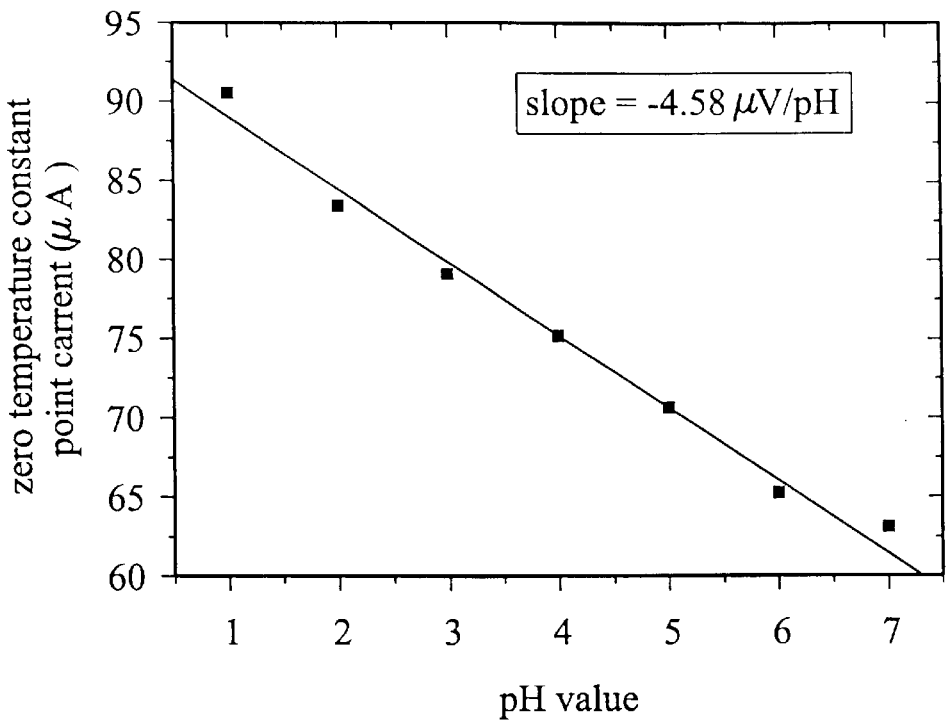
FIG. 7 shows a curve related to an zero temperature coefficient point and the pH value according to the present invention.

Afterwards, change the pH value of the buffer solution (such as pH=1–7) and repeat the steps b1 and b2 to get a zero temperature coefficient point at each pH value and find out each zero temperature coefficient point current corresponding to thereof (step b3). With reference to a curve obtained from statistical results shown in FIG. 7, the zero temperature coefficient point current becomes smaller when the corresponding pH value is higher. Then, equalize the zero temperature coefficient point currents respectively corresponding to pH=1 and pH=7 to gain an average current (step b4). Next, operate the a-Si:H ISFET at the average current and use the Keithley-236 current/voltage measuring device to measure the gate voltage of the a-Si:H ISFET (step b5). The increase or decrease in the gate voltage followed by temperature is the temperature parameter of the a-Si:H ISFET at the pH value.

Figure 8:
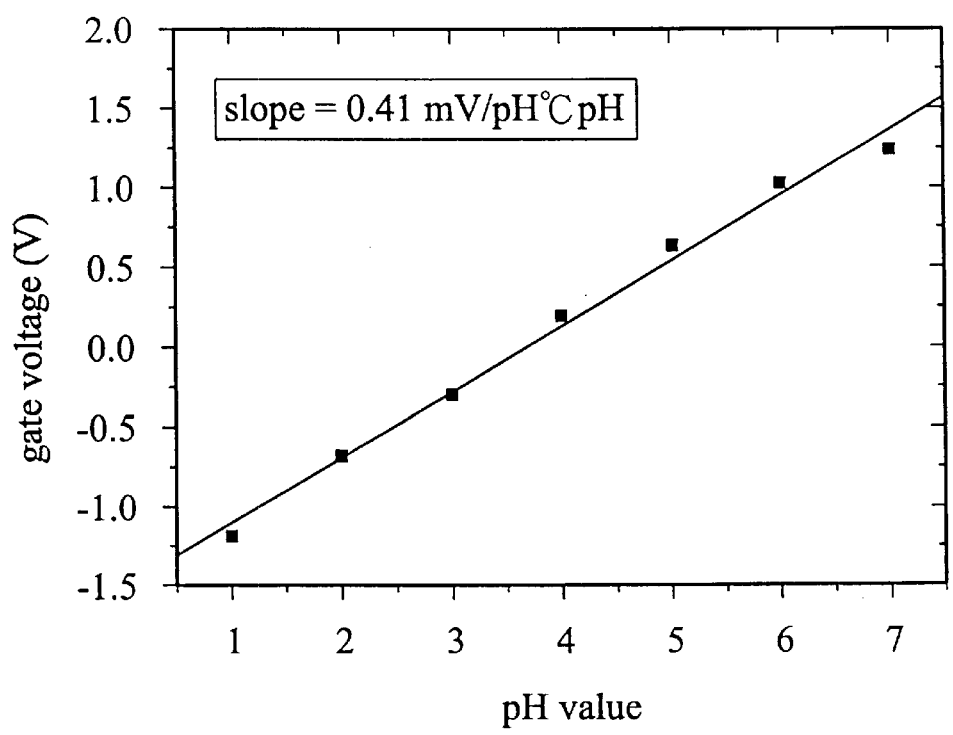
FIG. 8 shows a curve related to the temperature coefficient and the pH value when the ISFET is operated at the average current according to the invention.

Next, in order to measure different temperature parameters at different pH values, it only needs to change the pH value and repeat the steps b5 to obtain the statistic result curve as shown in FIG. 8 (step b6). It is found that the temperature parameter increases when the pH value slope of the curve is 0.41 mV/pH° C. Table 1 shows the relative characteristics between the temperature parameters of the a-Si:H ISFET and the pH values.

TABLE 1

| Temp. range | PH | Zero temp.- coefficient point current ($\mu$A) | Average temp. coefficient (mV/° C.) at 77.5 $\mu$A | variation (mV/pH ° C.) |
|---|---|---|---|---|
| 25~65° C. | 1 | 90.3 | -1.21 | 0.41 |
|  | 2 | 83.42 | -0.6 |  |
|  | 3 | 79.4 | -0.34 |  |
|  | 4 | 75.5 | 0.16 |  |
|  | 5 | 70.62 | 0.59 |  |
|  | 6 | 65.33 | 1.01 |  |
|  | 7 | 62.63 | 1.21 |  |

Consequently, after measuring the source/drain current and gate voltage in the solution with unknown concentration, the temperature parameters can be utilized to deduce the ion concentration or pH value of the solution with unknown concentration. Also, the method and apparatus of the present invention can be applied to the temperature parameter measurement of any other kind of ISFET.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An apparatus of measuring temperature parameters of an ISFET that uses hydrogenated amorphous silicon as a sensing film, comprising:

a semiconductor substrate where the ISFET is formed, wherein the semiconductor substrate comprises a pair of source and drain separated by each other and the sensing film insulated from the surface of the semiconductor substrate;

a buffer solution for contacting the ISFET;

a light-isolating container for loading the buffer solution and isolating light;

a heater for heating the buffer solution;

a temperature controller connected with the heater;

a test fixture connected with the source and drain of the ISFET; and a current/voltage measuring device connected the test fixture.

2. The apparatus of claim 1, further comprising a reference electrode, wherein one end of the reference electrode contacts the buffer solution and the other end of the reference electrode connects to the test fixture.

3. The apparatus of claim 2, wherein the sensing film of the ISFET and the surface of the semiconductor substrate are insulated by a silicon oxide layer.

4. The apparatus of claim 1, wherein the text fixture connects the source/drain of the ISFET through an aluminum contact plug and an aluminum wire.

5. The apparatus of claim 1, wherein the ISFET is sealed by epoxy resin.

6. The apparatus of claim 1, wherein the temperature controller is a PID temperature controller.

7. The apparatus of claim 1, wherein the buffer solution is phosphate buffer solution.

* * * * *

UNITED STATES PATENT AND TRADEMARK OFFICE
CERTIFICATE OF CORRECTION

PATENT NO.     : 6,573,741 B2
DATED          : June 3, 2003
INVENTOR(S)    : Jung C. Chou et al.

It is certified that error appears in the above-identified patent and that said Letters Patent is hereby corrected as shown below:

<u>Title page,</u>
Item [73], should read

-- [73] Assignee: National Yunlin University of Science and Technology
(Yunlin, Taiwan R.O.C.) --

Signed and Sealed this

Eighteenth Day of November, 2003

JAMES E. ROGAN
*Director of the United States Patent and Trademark Office*